(12) United States Patent
Kawashima et al.

(10) Patent No.: US 10,971,841 B2
(45) Date of Patent: Apr. 6, 2021

(54) BOARD CONNECTOR

(71) Applicants: AutoNetworks Technologies, Ltd., Mie (JP); Sumitomo Wiring Systems, Ltd., Mie (JP); SUMITOMO ELECTRIC INDUSTRIES, LTD., Osaka (JP)

(72) Inventors: Naomichi Kawashima, Mie (JP); Hirokazu Komori, Mie (JP)

(73) Assignees: AutoNetworks Technologies, Ltd.; Sumitomo Wiring Systems, Ltd.; Sumitomo Electric Industries, Ltd.

( * ) Notice: Subject to any disclaimer, the term of this patent is extended or adjusted under 35 U.S.C. 154(b) by 0 days.

(21) Appl. No.: 16/608,442

(22) PCT Filed: Apr. 9, 2018

(86) PCT No.: PCT/JP2018/014836
§ 371 (c)(1),
(2) Date: Oct. 25, 2019

(87) PCT Pub. No.: WO2018/198731
PCT Pub. Date: Nov. 1, 2018

(65) Prior Publication Data
US 2020/0194915 A1     Jun. 18, 2020

(30) Foreign Application Priority Data

Apr. 28, 2017 (JP) .............................. JP2017-089470

(51) Int. Cl.
*H01R 13/64*     (2006.01)
*H01R 12/73*     (2011.01)
(Continued)

(52) U.S. Cl.
CPC ............. *H01R 12/73* (2013.01); *H01R 12/57* (2013.01); *H01R 13/502* (2013.01); *H01R 13/73* (2013.01); *H05K 3/34* (2013.01)

(58) Field of Classification Search
CPC ...... H01R 12/73; H01R 12/57; H01R 13/502; H01R 13/73; H05K 3/34
(Continued)

(56) References Cited

U.S. PATENT DOCUMENTS

| 6,171,142 B1* | 1/2001 | Wang ................. H01R 12/7029 |
| | | 439/567 |
| 2008/0290236 A1* | 11/2008 | Sakamoto ............ H01R 12/707 |
| | | 248/309.1 |

(Continued)

FOREIGN PATENT DOCUMENTS

| JP | 4-85682 | 7/1992 |
| JP | 11-067374 | 3/1999 |

(Continued)

OTHER PUBLICATIONS

International Search Report dated May 15, 2018.

*Primary Examiner* — Abdullah A Riyami
*Assistant Examiner* — Nelson R. Burgos-Guntin
(74) *Attorney, Agent, or Firm* — Gerald E. Hespos; Michael J. Porco; Matthew T. Hespos

(57) ABSTRACT

A board connector (A) is provided with a housing (10) placed on a circuit board (P) and including a terminal holding wall (11) substantially at a right angle to the circuit board (P) and supporting walls (15) extending rearward from sides of the terminal holding wall (11). Terminal fittings (25, 26) penetrate through the terminal holding wall (11) and are connectable to the circuit board (P) behind the terminal holding portion (11). Fixing brackets are mounted on the supporting walls (15) and are fixable to the circuit board (P) by soldering. A reinforcing portion (20: 21 or 23) links the supporting walls (15) and a rear surface of the terminal holding wall (11).

12 Claims, 10 Drawing Sheets

(51) Int. Cl.
*H01R 12/57* (2011.01)
*H01R 13/502* (2006.01)
*H01R 13/73* (2006.01)
*H05K 3/34* (2006.01)

(58) Field of Classification Search
USPC .......................................................... 439/83
See application file for complete search history.

(56) References Cited

U.S. PATENT DOCUMENTS

| | | | | |
|---|---|---|---|---|
| 2012/0149217 | A1* | 6/2012 | Kobayashi | H01R 12/725 439/74 |
| 2015/0155661 | A1* | 6/2015 | Chen | H01R 13/6582 439/607.01 |
| 2016/0133661 | A1* | 5/2016 | Fujiuchi | H04N 1/19 257/432 |
| 2019/0157806 | A1* | 5/2019 | Suzuki | H01R 13/502 |
| 2020/0137904 | A1* | 4/2020 | Komori | H05K 5/0034 |
| 2020/0194915 | A1* | 6/2020 | Kawashima | H01R 13/73 |

FOREIGN PATENT DOCUMENTS

| | | |
|---|---|---|
| JP | 2007-265903 | 10/2007 |
| JP | 2015-079713 | 4/2015 |

\* cited by examiner

BOARD CONNECTOR

BACKGROUND

Field of the Invention

The invention relates to a board connector.

Related Art

Japanese Unexamined Patent Publication No. 2015-79713 discloses a board connector to be mounted on the upper surface of a circuit board. The board connector includes a housing made of synthetic resin. The housing includes a terminal holding portion, and a rectangular tubular receptacle extends forward from the outer peripheral edge of the terminal holding portion. Terminal fittings penetrate through the terminal holding portion so that tip parts of the terminal fittings are accommodated in the receptacle. Rear end parts of the terminal fittings are exposed behind the terminal holding portion and are fixed conductively to the circuit board by soldering.

This board connector is fixed to the circuit board only at soldered parts of the terminal fittings. Thus, a means for enhancing the reliability of fixing strength is desired. A method has been considered for mounting fixing brackets on supporting walls projecting rearward from the terminal holding portion and soldering lower end parts of the fixing brackets to the circuit board for enhancing the fixing strength. However, if the lower ends of the fixing brackets are fixed to the circuit board, stress concentrates on soldered parts of the fixing brackets and on the circuit board, and there is a concern for solder crack when the supporting walls are tilted due to thermal deformation of the housing.

The invention was completed on the basis of the above situation and aims to alleviate stress generated at a soldered part of a fixing bracket mounted on a housing and a circuit board.

SUMMARY

The invention is directed to a board connector with a housing placed on a circuit board. The housing includes a terminal holding wall aligned substantially at a right angle to the circuit board and a supporting wall extending rearward from a side of the terminal holding wall. A terminal fitting penetrates through the terminal holding wall so that the terminal fitting is connectable to the circuit board behind the terminal holding wall. A fixing bracket is mounted on the supporting wall and is fixable to the circuit board by soldering. A reinforcing portion links the supporting wall and a rear surface of the terminal holding wall.

The supporting wall portion is linked to the terminal holding wall via the reinforcing portion to suppress tilt of the terminal holding wall. In this way, stress generated at a soldered part of the fixing bracket and the circuit board due to the tilt of the supporting wall is suppressed.

The reinforcing portion may include an upper linking portion that links an upper part of the supporting wall and an upper part of the terminal holding. The upper part of the supporting wall has a maximum displacement amount when the supporting wall is tilted. This upper part of the supporting wall is linked to the terminal holding portion via the upper of linking portion. Thus, the tilt of the supporting wall portion can be suppressed effectively.

The upper end of the linking portion may constitute a plate-like upper wall substantially at a right angle to the terminal holding wall and the supporting wall. Since the plate-like upper wall has a high rigidity, the tilt of the supporting wall can be prevented effectively.

The upper wall may cover a substantially entire region of an upper surface of a terminal accommodation space defined by the terminal holding portion and the supporting wall. According to this configuration, a region of the terminal fitting accommodated in the terminal accommodation space can be protected from the interference of external matter.

The reinforcing portion may include a lower linking portion linking a lower part of the supporting wall and a lower part of the terminal holding portion. In a state before the housing is mounted on the circuit board, external matter from below may interfere with a region of the terminal fitting projecting rearward from the terminal holding portion. However, the lower linking portion prevents interference of external matter from below.

The lower linking portion may constitute a plate-like lower wall substantially at a right angle to the terminal holding wall and the supporting wall. Since the lower wall has a high rigidity, the interference of external matter from below can be prevented.

The lower wall may cover a substantially entire region of a lower surface of the terminal accommodation space defined by the terminal holding portion and the supporting wall. According to this configuration, external matter cannot interfere with the region of the terminal fitting accommodated in the terminal accommodation space.

DETAILED DESCRIPTION

Figure 1:
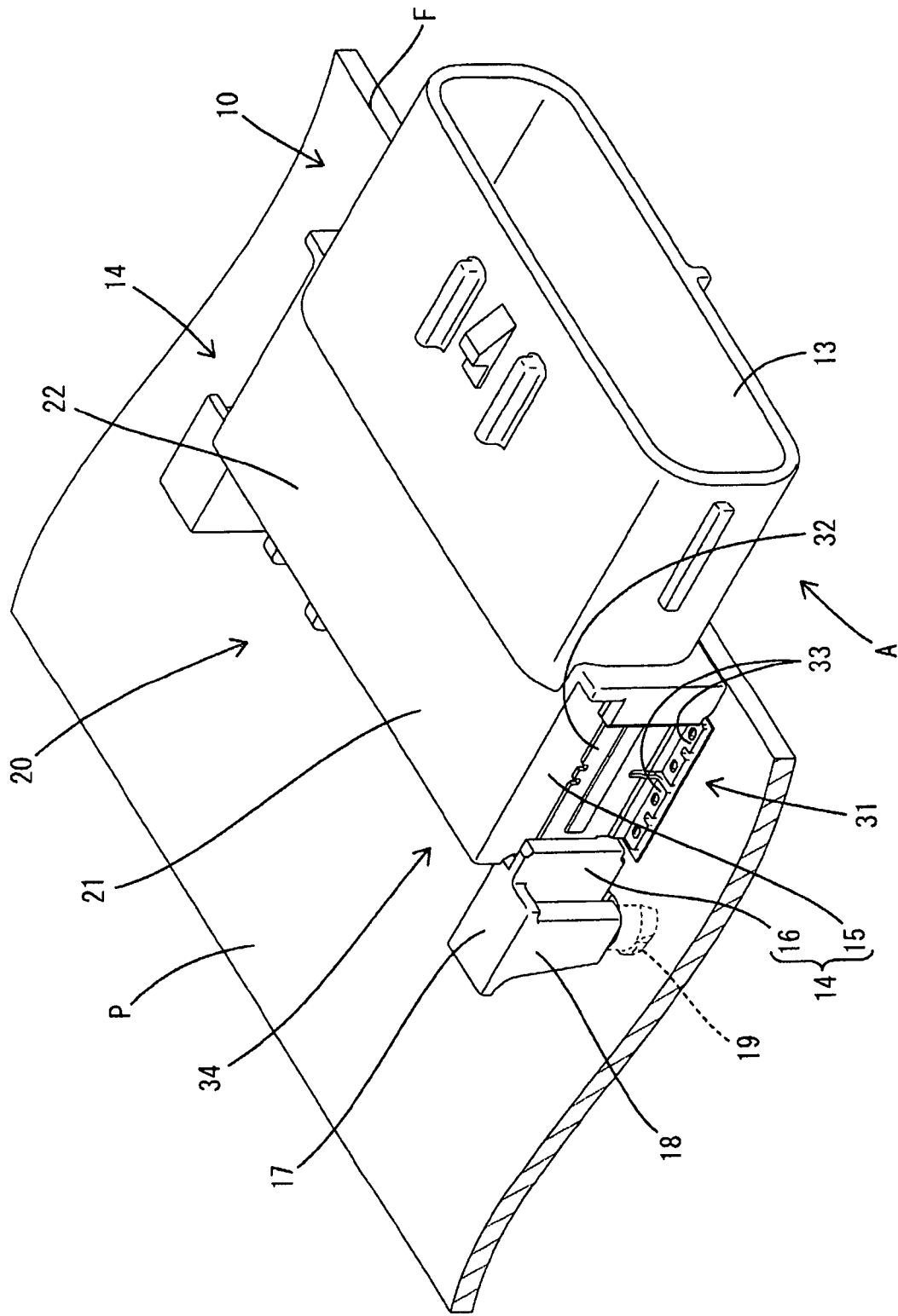
FIG. 1 is a perspective view in a state where a board connector of an embodiment is mounted on a circuit board.
Figure 2:
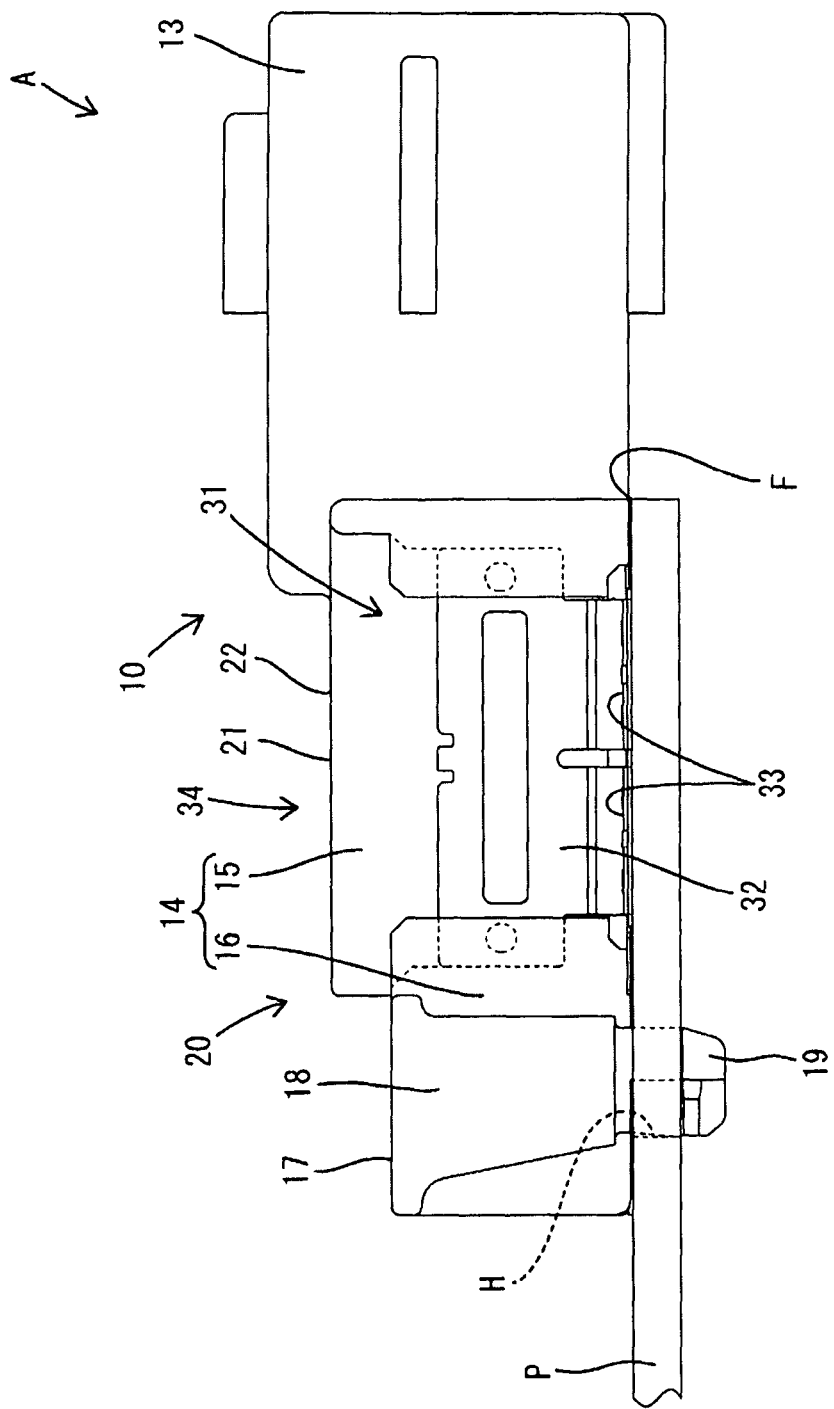
FIG. 2 is a side view in the state where the board connector is mounted on the circuit board.
Figure 3:
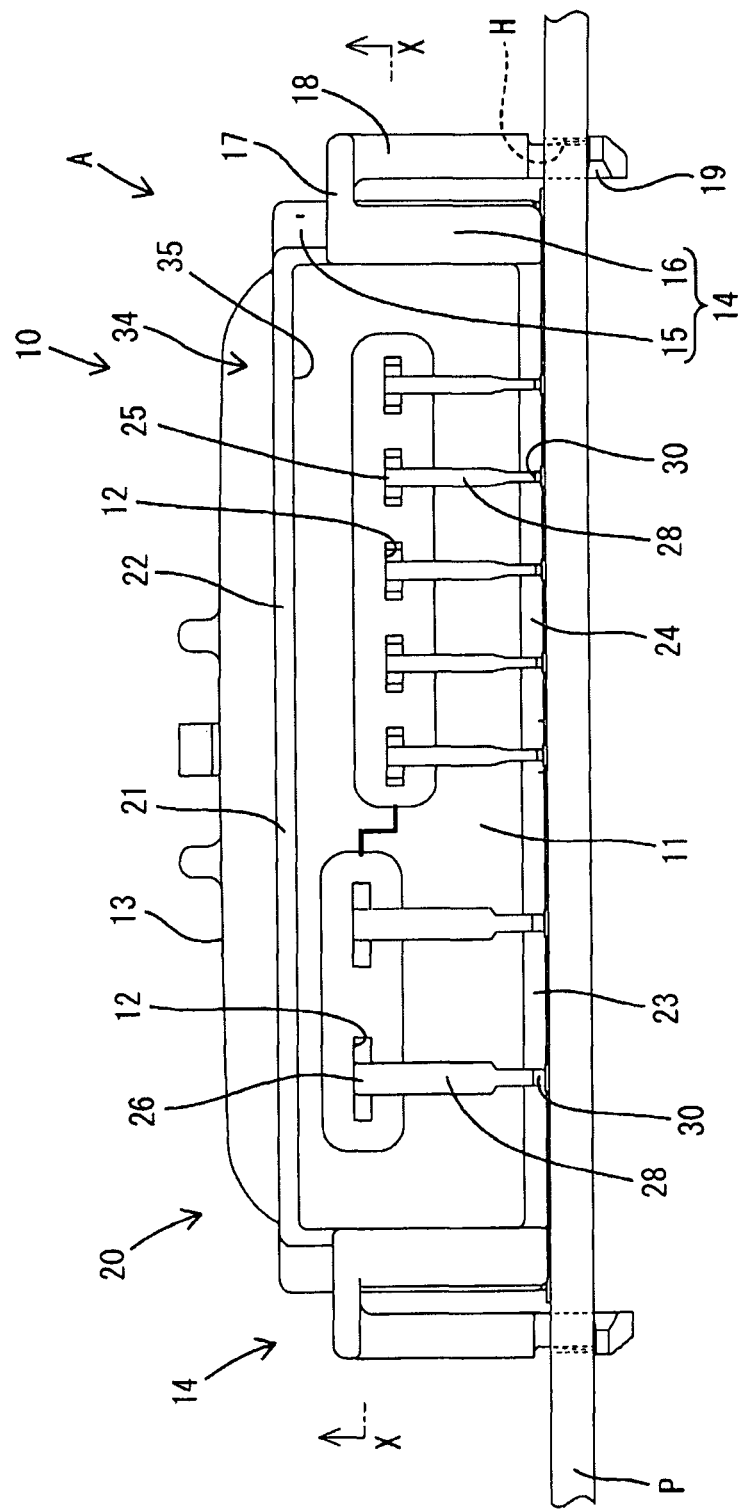
FIG. 3 is a back view in the state where the board connector is mounted on the circuit board.
Figure 4:
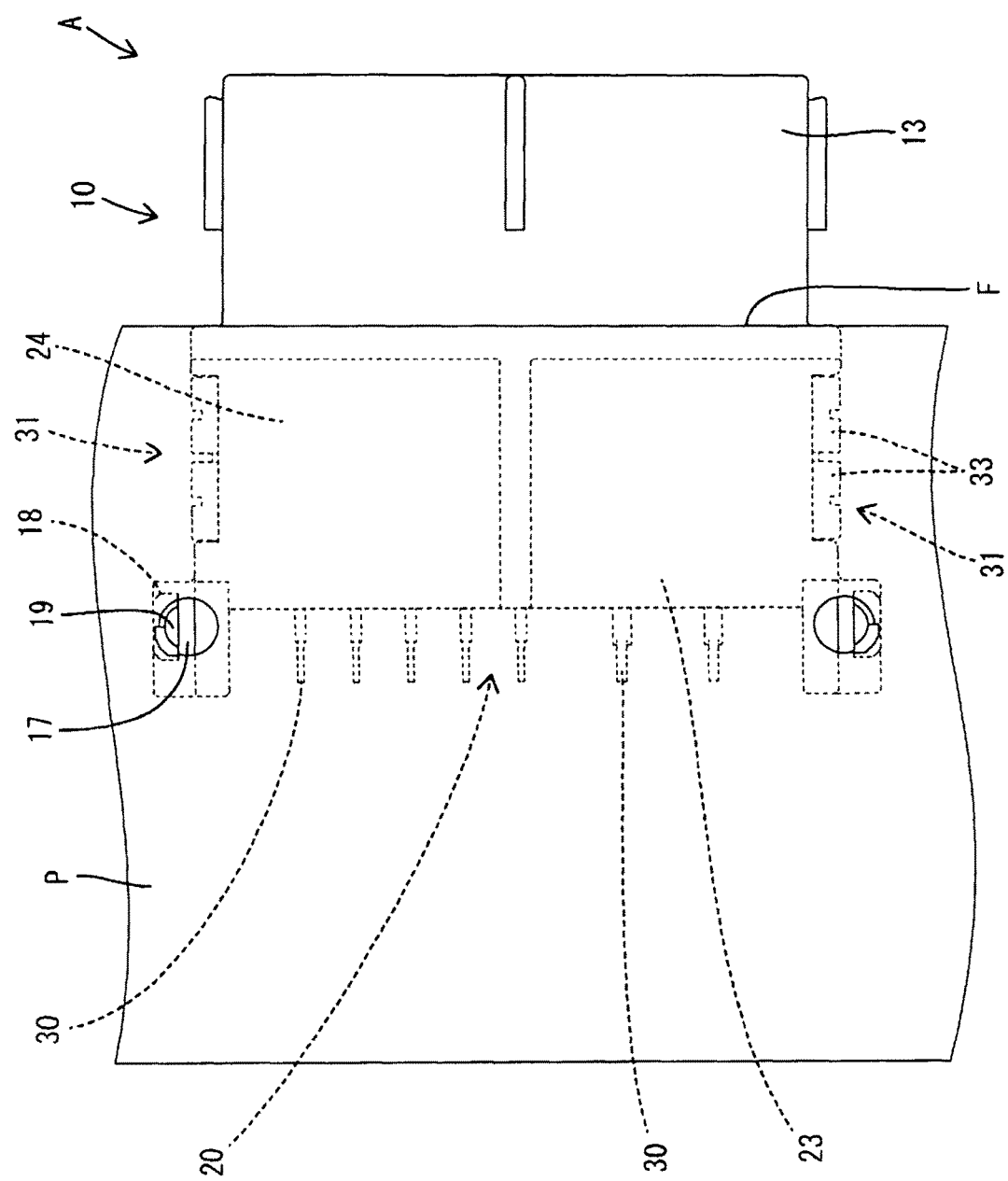
FIG. 4 is a bottom view in the state where the board connector is mounted on the circuit board.
Figure 5:
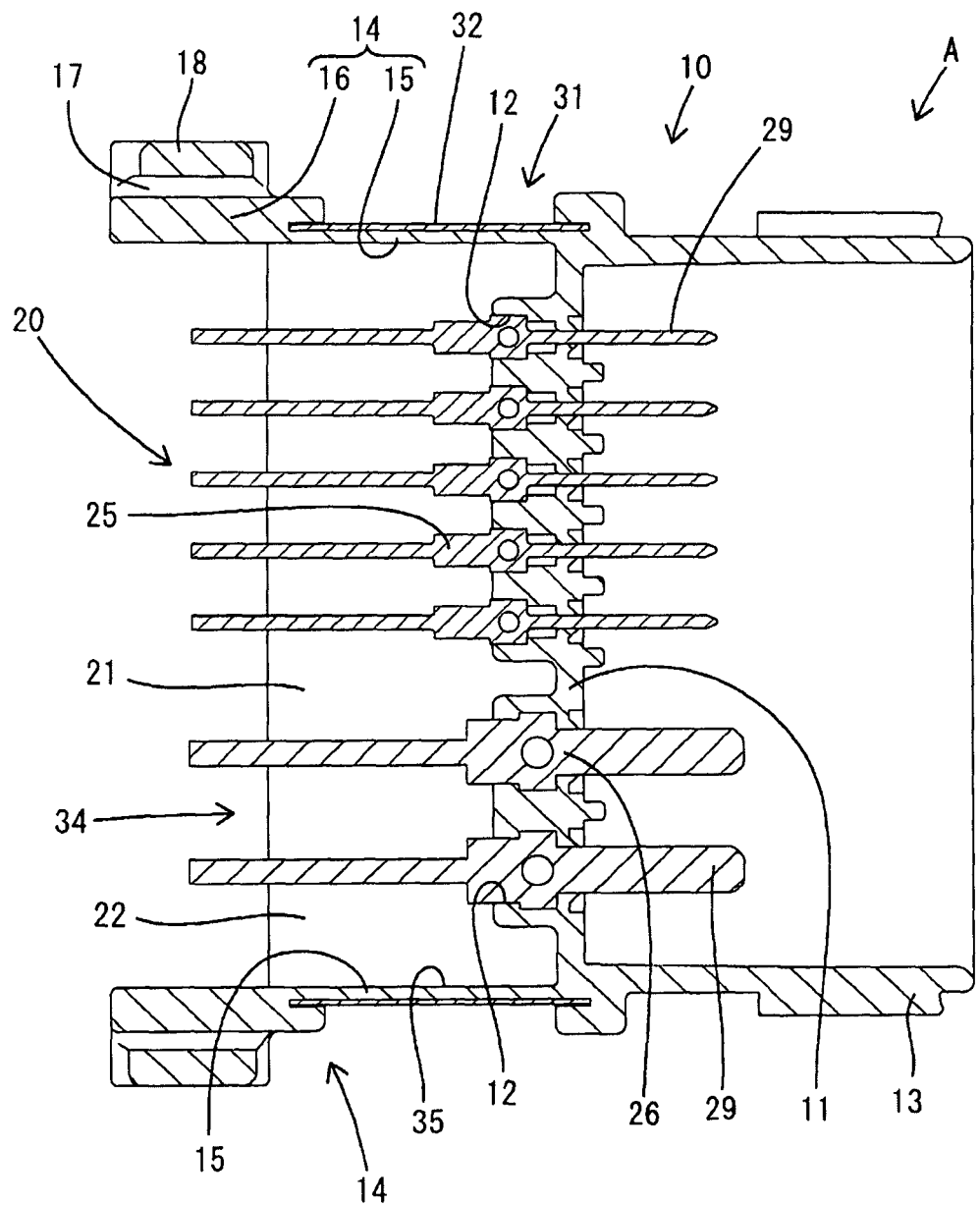
FIG. 5 is a section along X-X of FIG. 3.

A specific embodiment of the invention is described with reference to FIGS. 1 to 11. Note that, in the following description, a right side in FIGS. 2, 4, 5, 6 and 8 is defined as a front concerning a front-rear direction. Upper and lower sides shown in FIGS. 1 to 3, 6 and 7 are defined as upper and lower sides concerning a vertical direction.

A board connector A of this embodiment is fixed by being placed on a front part of the upper surface of a circuit board P. The circuit board P is formed with left and right locking holes H that are disposed at positions slightly behind a front edge F of the circuit board P and spaced apart by a predetermined distance in a lateral direction.

The board connector A includes a housing 10 made of synthetic resin, terminal fittings 25, 26, and a left and right fixing brackets 31. The housing 10 is a single component including a terminal holding portion 11, a receptacle 13, two bilaterally symmetrical side walls 14, two bilaterally symmetrical locks 19, an upper wall 22 and a lower wall 24. The terminal holding portion 11 is a wall substantially at a right angle to the upper surface of the circuit board P and a wall thickness direction thereof is oriented in the front-rear direction. Press-fit holes 12 penetrate through the terminal holding portion 11 in the front-rear direction. The receptacle 13 is a substantially rectangular tube projecting forward from the outer periphery of the terminal holding portion 11.

Figure 9:
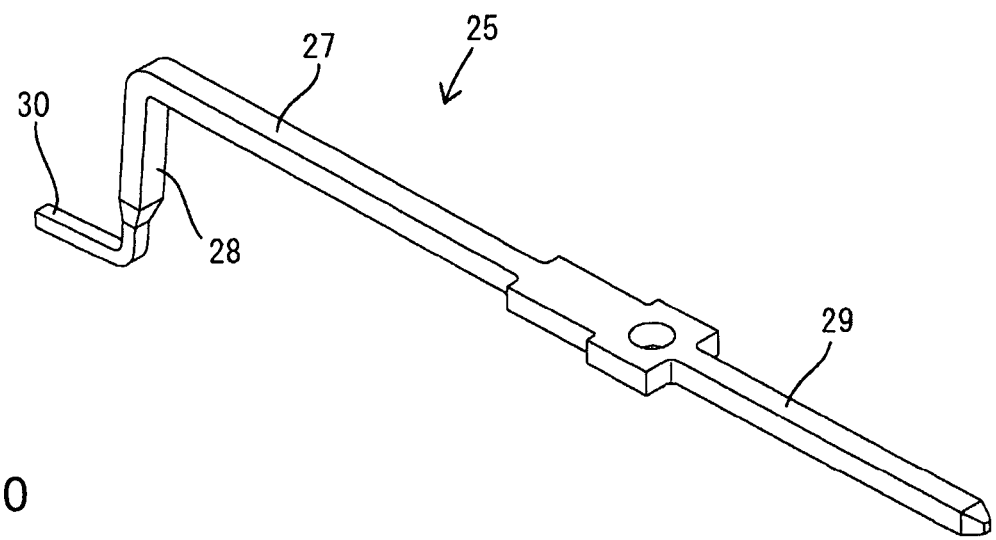
FIG. 9 is a perspective view of a first terminal fitting.
Figure 10:
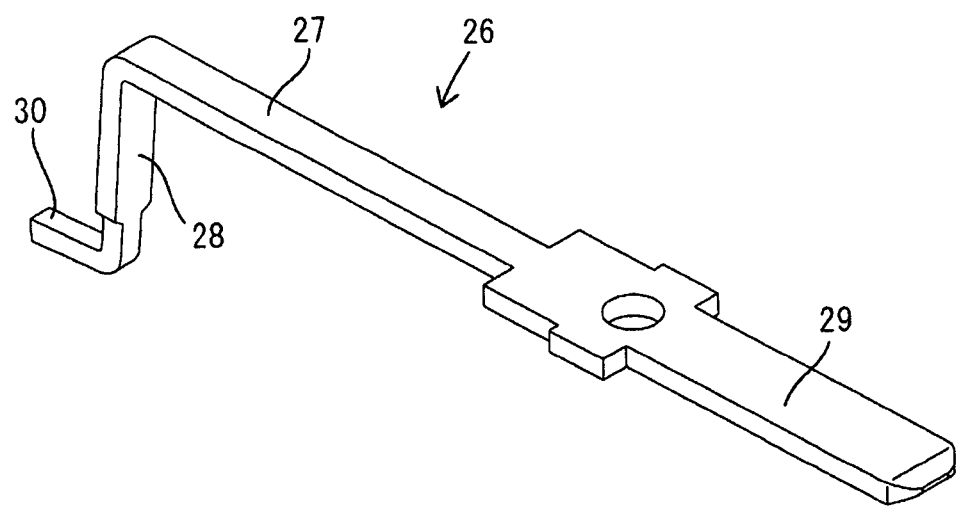
FIG. 10 is a perspective view of a second terminal fitting.
Figure 11:
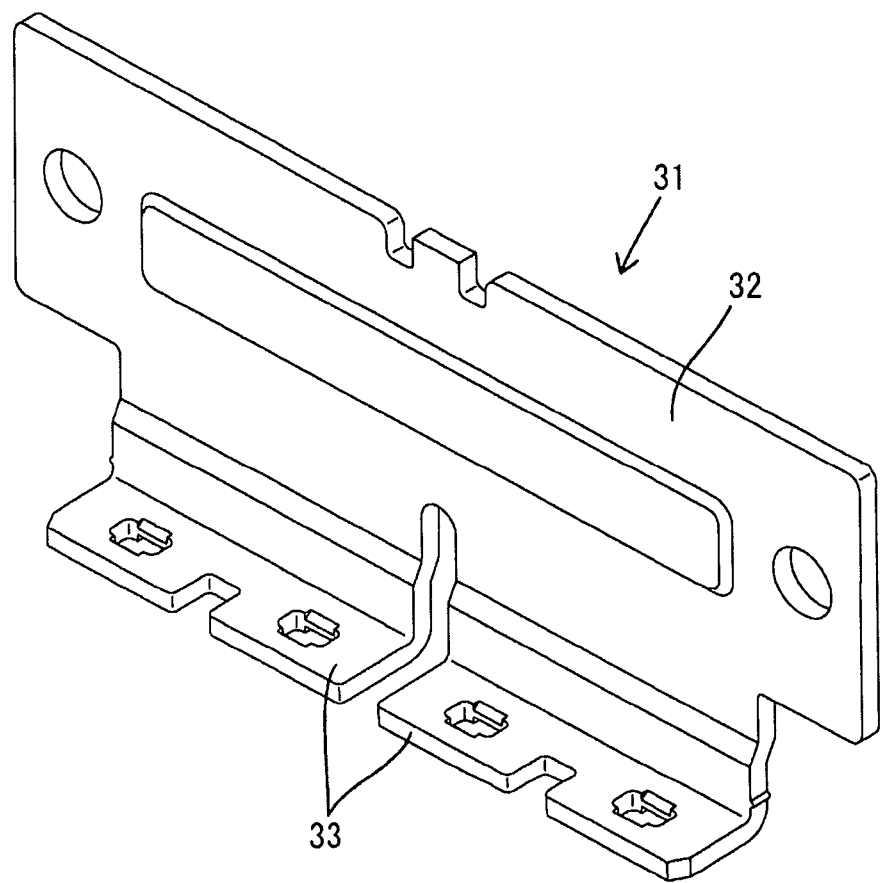
FIG. 11 is a perspective view of a fixing bracket.

First terminal fittings 25 and second terminal fittings 26 are mounted into the terminal holding portion 11 by being press-fit into the press-fit holes 12 from behind. As shown in FIGS. 9 and 10, each of these terminal fittings 25, 26 is formed by bending an elongated bar material and includes a harness side connecting portion 27 and a board connecting portion 28. The harness side connecting portion 27 extends in the front-rear direction and penetrating through the terminal holding portion 11. The board connecting portion 28 extends down substantially at a right angle from the rear end of the harness side connecting portion 27. A front part of the harness side connecting portion 27 is accommodated in the receptacle 13 and functions as a tab 29 connectable to a mating terminal (not shown) of a harness side connector (not shown). The board connecting portion 28 is disposed behind the terminal holding portion 11, and a lower part thereof serves as a conductive portion 30 projecting horizontally rearward.

The left and right side walls 14 are cantilevered rearward from both left and right sides of the terminal holding portion 11, and wall thickness directions thereof are oriented in the lateral direction. Front end regions of the side walls 14 directly connected to the terminal holding portion 11 function as supporting walls 15. The fixing brackets 31 are mounted on the outer surfaces of the supporting walls 15. The supporting walls 15 (side walls 14) function to support the fixing brackets 31. Each fixing bracket 31 is a single component including a plate-like mounting portion 32 disposed to cover the outer surface of the supporting wall 15 and a fixing portion 33 projecting laterally out from the lower end of the plate-like mounting portion 32 and disposed at such a height as to be substantially flush with the lower end of the supporting wall 15.

Figure 6:
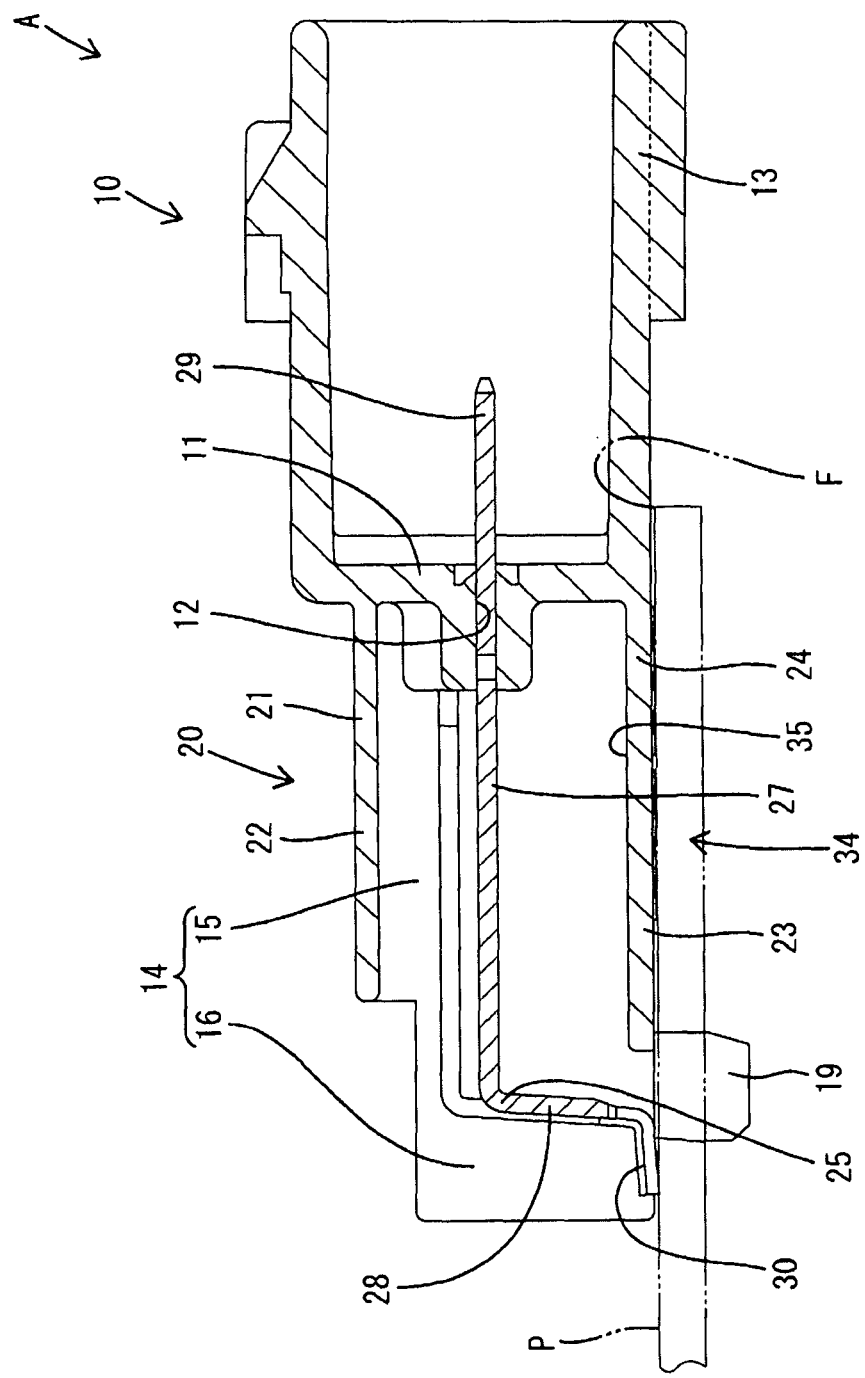
FIG. 6 is a side view in section of the board connector.
Figure 7:
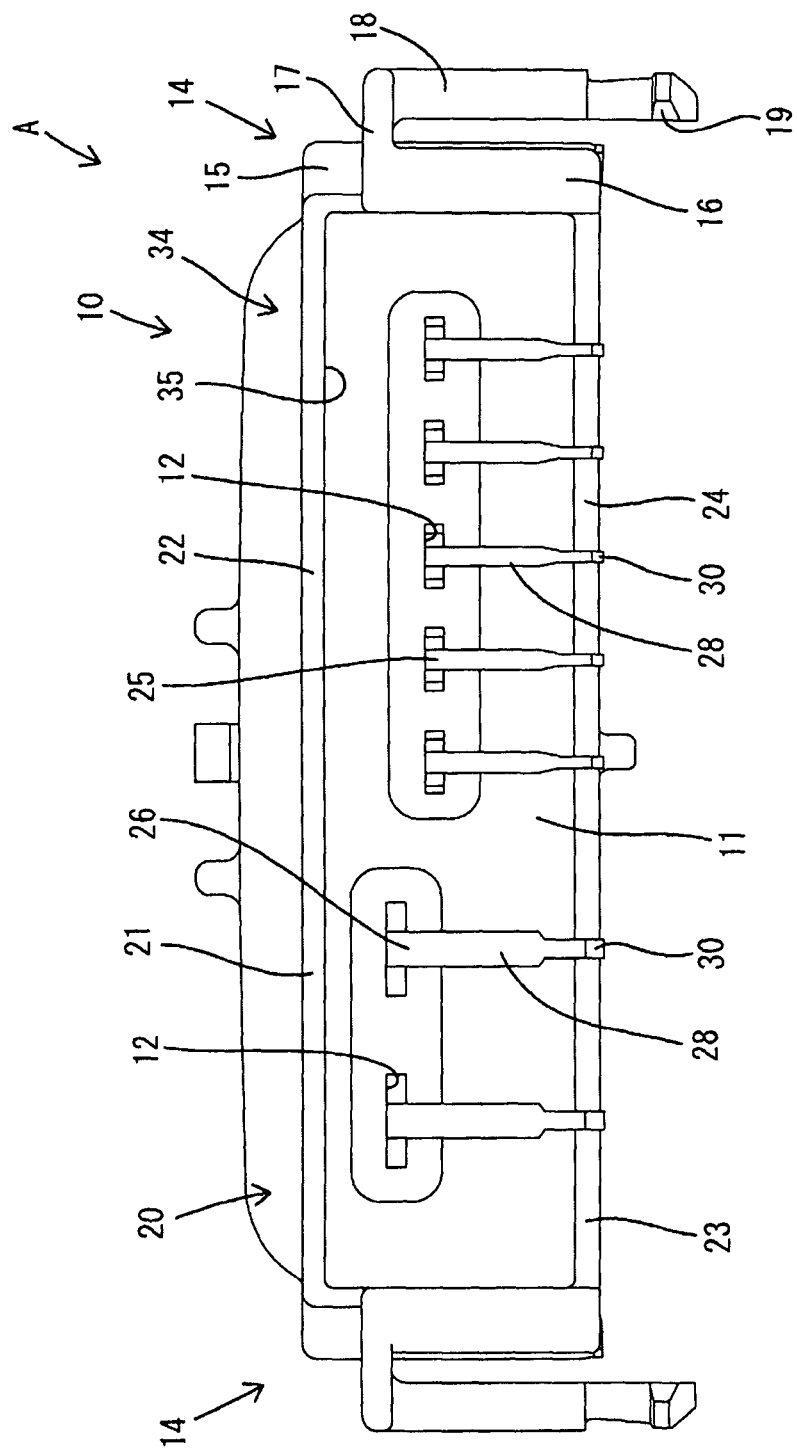
FIG. 7 is a back view of the board connector.
Figure 8:
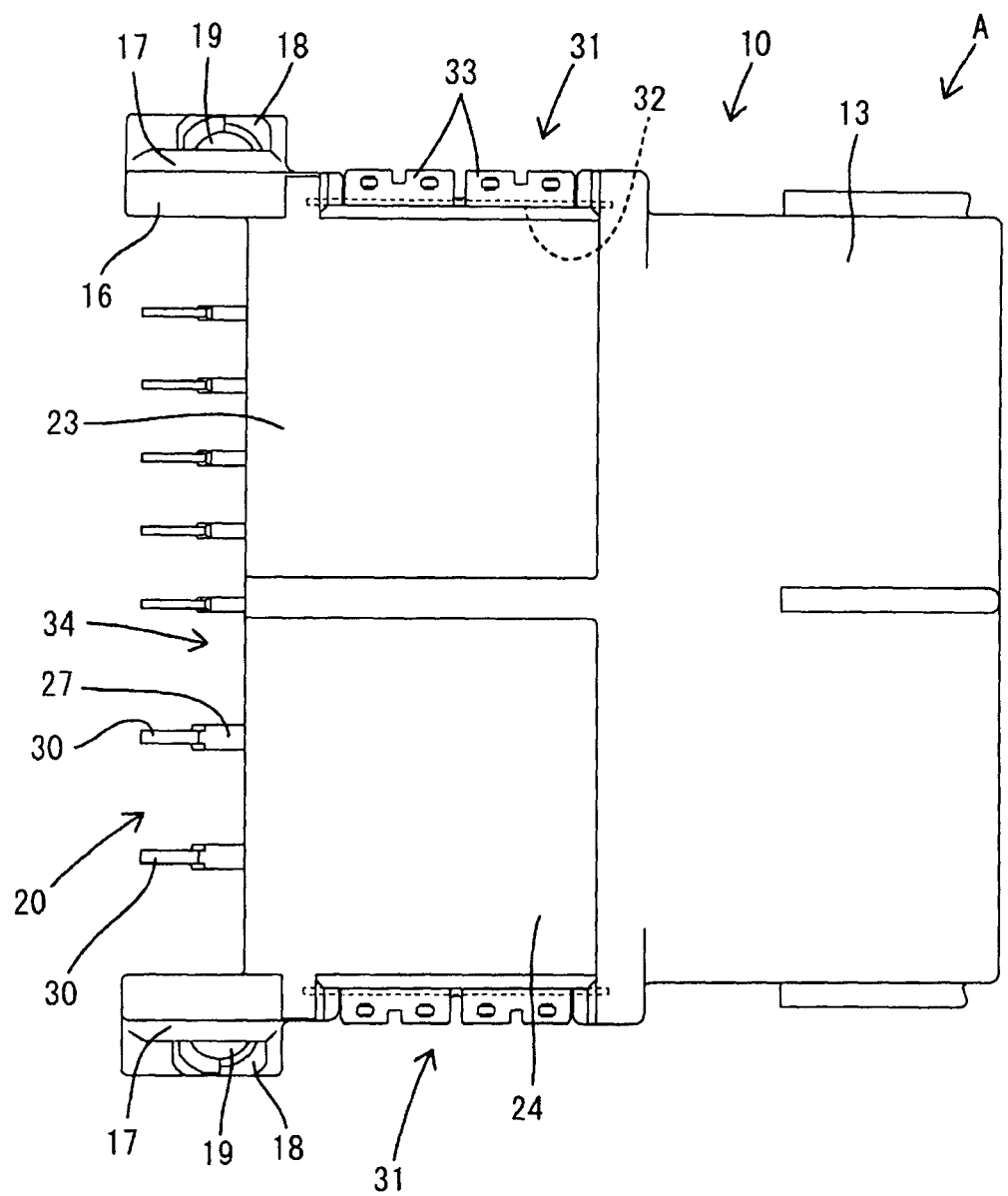
FIG. 8 is a bottom view of the board connector.

A rear end region of the side wall 14 functions as a protection wall 16. As shown in FIG. 6, the rear end of the protection wall 16 (rear end of the housing 10) is substantially at the same position as the rear ends of the conductive portions 30 (board connecting portions 28) of the terminal fittings 25, 26 in the front-rear direction. Particularly, the rear end of the protection wall 16 is located slightly behind the rear ends of the conductive portions 30. Thus, the left and right side walls 14 are located to sandwich regions of the terminal fittings 25, 26 exposed rearward from the terminal holding portion 11 from both left and right sides, and have a function of protecting these terminal fittings 25, 26 from the interference of external matter.

Upper parts of the both left and right protection walls 16 serve as resilient supports 17 in the form of ribs projecting laterally outward. The resilient supports 17 are resiliently deformable. Legs 18 extend down on projecting end parts of the resilient supports 17. Each leg 18 is formed with a lock 19 projecting down from the lower end surface of the leg 18. A locking projection to be locked to a lower end part of an opening edge of the locking hole H of the circuit board P is formed on the outer periphery of a lower end part of the lock 19. Each lock 19 is disposed substantially at the same position as the conductive portions 30 of the board connecting portions 28 of the terminal fittings 25, 26 in the front-rear direction. Further, each lock 19 is disposed behind the fixing bracket 31.

The housing 10 is formed integrally with a reinforcing portion 20 as a means for restricting or suppressing lateral tilt of the left and right wall 14. The reinforcing portion 20 includes an upper linking portion 21 and a lower linking portion 23. The upper linking portion 21 links upper end parts of the supporting walls 15 and an upper end part of the rear surface of the terminal holding portion 11, and constitutes the upper wall 22. The lower linking portion 23 links lower end parts of the supporting walls 15 and a lower end part of the rear surface of the terminal holding portion 11, and constitutes the lower wall 24.

The upper wall 22 is a plate-like part substantially at a right angle to the rear surface of the terminal holding portion 11 and the supporting walls 15 and has a substantially rectangular shape in a plan view. The front end of the upper wall 22 is connected to the upper end edge of the terminal holding portion 11 over the entire length (entire width) thereof. Both left and right sides of the upper wall 22 are connected to the upper ends of the supporting walls 15 over the entire lengths thereof. The upper wall 22 has substantially the same dimension in the front-rear direction as the supporting walls 15. Thus, the protection walls 16 project rearward from the rear end of the upper wall portion 22.

The lower wall 24 is a plate-like part substantially at a right angle to the rear surface of the terminal holding portion 11 and the supporting walls 15 and having a substantially rectangular shape in a plan view. The front end of the lower wall 24 is connected to the lower end edge of the terminal holding portion 11 over the entire length (entire width) thereof. Both left and right sides of the lower wall 24 are connected to the lower ends of the supporting walls 15 over the entire lengths thereof. The lower wall 24 has substantially the same dimension in the front-rear direction as the supporting walls 15. Thus, the protection walls 16 project rearward from the rear end of the lower wall 24.

A region of the housing 10 behind the terminal holding portion 11 serves as a box 34 defined by the terminal holding portion 11, the left and right supporting walls 15, the upper wall 22 and the lower wall 24. An internal space of the box portion 34 serves as a terminal accommodation space 35 having a rear surface open to outside. Regions of the harness side connecting portions 27 of the terminal fittings 25, 26 projecting rearward from the terminal holding portion 11 and regions of the board connecting portions 28 excluding rear end parts are accommodated in the terminal accommodation space 35. The rear ends of the board connecting portions 28 including the conductive portions 30 project rearward from the terminal accommodation space 35, but are sandwiched from both left and right sides by the left and right protection walls 16. Thus, there is no possibility that these rear end parts are interfered with by external matter in the lateral direction.

The board connector A of this embodiment includes the housing 10 and the terminal fittings 25, 26. The housing 10 includes the terminal holding portion 11 and the receptacle 13 extending forward from the outer periphery of the terminal holding portion 11, and is placed on the circuit board P. The terminal fittings 25, 26 are mounted while penetrating through the terminal holding portion 11, and connected to the circuit board P while being placed on the circuit board P behind the terminal holding portion 11.

In mounting this board connector A on the circuit board P, the board connector A and the circuit board P are passed through a reflow furnace and solder on the circuit board P is melted under a high-temperature environment of the reflow furnace with the housing 10 placed at a predetermined position of the circuit board P. Thus, the fixing portions 33 of the fixing brackets 31 and the conductive portions 30 of the terminal fittings 25, 26 are fixed to the circuit board P. In passing the circuit board P and the board connector A through the reflow furnace, the housing 10 is placed on the upper surface of the circuit board P. Since the board connector A of this embodiment is waterproof, the housing 10 needs to be placed on the circuit board P so that the receptacle 13 projects farther forward than the front end edge F of the circuit board P in a plan view. The reason for that is as follows.

If the board connector A is waterproof, the harness side connector (not shown) to be connected to the board connector A is provided with a sealing ring to be held in close contact with the inner periphery of the receptacle 13 and a tubular fitting for protecting the sealing ring. Thus, when the tubular fitting is fit to the outer periphery of the receptacle 13, the interference of the tubular fitting portion and the circuit board P needs to be avoided. Therefore, the receptacle 13 needs to be farther forward than the front edge F of the circuit board P.

If the terminal fittings 25, 26 project out in front of the circuit board P, the board connector A may tilt forward and detach from the circuit board P when the board connector A is placed on the circuit board P. Accordingly, the housing 10 is formed with the locks 19 for restricting a forward tilting displacement of the housing 10 by being locked to the circuit board P. Inserting and locking these locks 19 in the locking holes H of the circuit board P restricts forward tilting displacement of the housing 10. Therefore, the board connector A can be placed stably on the circuit board P.

The size of the locks 19 and a thickness of the circuit board P unavoidably vary within the range of dimensional tolerances in manufacturing. Thus, vertical rattling may occur between the locks 19 and the circuit board P when the locks 19 are locked into the locking holes H. As a countermeasure against this, the locks 19 are disposed on a rear part of the housing 10, focusing on the front end edge F of the circuit board P serving as a fulcrum of a forward tilting displacement when the housing 10 is tilted forward and displaced. Therefore, even if rattling occurs between the locks 19 and the circuit board P, a vertical displacement amount of the housing 10 is suppressed to be equal to or less than the amount of rattling between the locks 19 and the circuit board P. In this way, the terminal fittings 25, 26 can be connected reliably to the circuit board P.

Further, the terminal fittings 25, 26 include the board connecting portions 28 to be fixed to the circuit board P by soldering while being placed on the circuit board P. When the housing 10 is tilted forward and displaced, the front edge F of the circuit board P serves as a fulcrum of a forward tiling displacement and both the board connecting portions 28 and the locks 19 are disposed behind the fulcrum of the forward tilting displacement. Focusing on this point, the locks 19 are disposed substantially at the same position as the board connecting portions 28 in the front-rear direction. Accordingly, even if vertical rattling occurs between the locks 19 and the circuit board P, vertical displacement amounts of the board connecting portions 28 are suppressed to be equal to or less than the amount of rattling between the locks 19 and the circuit board P. In this way, the terminal fittings 25, 26 can be connected reliably to the circuit board P.

Furthermore, the housing 10 is formed with the side walls 14 extending rearward from the side edge parts of the terminal holding portion 11, and the fixing brackets 31 fixable to the circuit board P by soldering are mounted on the side walls 14. When the housing 10 is tilted forward and displaced, the front edge F of the circuit board P serves as a fulcrum of a forward tiling displacement and both the fixing brackets 31 and the locks 19 are disposed behind the fulcrum of the forward tilting displacement. Focusing on this point, the locks 19 are disposed behind the fixing brackets 31.

According to this configuration, even if vertical rattling occurs between the locks 19 and the circuit board P, vertical displacement amounts of the fixing brackets 31 are suppressed to be equal to or less than the amount of rattling between the locks 19 and the circuit board P. In this way, the fixing brackets 31 can be soldered reliably to the circuit board P.

The housing 10 is formed with the side walls 14 extending rearward from the sides of the terminal holding portion 11. The side walls 14 are formed with the legs 18 connected via the resilient supports 17, and the locks 19 are formed on the lower ends of the legs 18. According to this configuration, even if the positions of the locking holes H of the circuit board P and the positions of the locks 19 of the housing 10 vary in the front-rear direction and lateral direction, such variations (dimensional errors) are absorbed by resilient deformation of the resilient supports 17. Therefore, excessive stress is not generated at the locks 19.

The board connector A includes the left and right side walls 14 extending rearward from the sides of the terminal holding portion 11 and disposed to sandwich the terminal fittings 25, 26. Additionally, the fixing brackets 31 are mounted on the side walls 14 and are fixable to the circuit board P by soldering. The locks 19 are continuous with the side walls 14. According to this configuration, the side walls 14 have a function of supporting the fixing brackets 31, a function of protecting the terminal fittings 25, 26 from both left and right sides and a function of supporting the locks 19. Thus, the shape of the housing 10 can be simplified as compared to the case where dedicated parts for exhibiting these three functions are formed separately.

The board connector A includes the housing 10, the terminal fittings 25, 26 and the fixing brackets 31. The housing 10 includes the wall-like terminal holding portion 11 substantially at a right angle to the circuit board P and the left and right supporting walls 15 extending rearward from the sides of the terminal holding portion 11, and is placed on the circuit board P. The terminal fittings 25, 26 are penetrate through the terminal holding portion 11, and are connected to the circuit board P behind the terminal holding portion 11. The fixing brackets 31 are mounted on the supporting walls 15 and fixed to the circuit board P by soldering.

As a means for alleviating stress generated at soldered parts of the fixing brackets 31 mounted on the housing 10 and the circuit board P, the housing 10 is formed integrally with the reinforcing portion 20 linking the supporting walls 15 and the rear surface of the terminal holding portion 11. The supporting walls 15 are linked to the terminal holding portions 11 via the reinforcing portion 20 to suppress tilt. In this way, stress generated at the soldered parts of the fixing brackets 31 and the circuit board P due to the tilt of the supporting walls 15 is suppressed.

The reinforcing portion 20 includes the upper linking portion 21 linking the upper parts of the supporting walls 15 and the upper end part of the terminal holding portion 11. According to this configuration, the upper parts of the supporting walls 15 have a maximum displacement amount when the supporting walls 15 are tilted, and these upper parts are linked to the terminal holding portion 11 via the upper linking portion 21. Thus, the tilt of the supporting walls 15 can be suppressed. Furthermore, the upper linking portion 21 constitutes the plate-like upper wall 22 that is substantially at a right angle to the terminal holding portion 11 and the supporting walls 15. The plate-like upper wall 22 has a high rigidity and suppresses tilting of the supporting walls 15.

The reinforcing portion 20 includes the lower linking portion 23 linking the lower end parts of the supporting walls 15 and the lower end part of the terminal holding portion 11. In a state before the housing 10 is mounted on the circuit board P, external matter from below may interfere with the regions of the terminal fittings 25, 26 projecting rearward from the terminal holding portion 11. However, the lower linking portion 23 prevents the interference of external matter with the terminal fittings 25, 26 from below. Furthermore, the lower linking portion 23 constitutes the plate-like lower wall 24 that is substantially at a right angle to the terminal holding portion 11 and the supporting walls 15. The plate-like lower wall 24 has a high rigidity and prevents interference of external matter with the terminal fittings 25, 26 from below.

The upper wall 22 covers substantially the entire region of the upper surface of the terminal accommodation space 35 defined by the terminal holding portion 11 and the supporting walls 15. Thus, the regions of the terminal fittings 25, 26 accommodated in the terminal accommodation space 35 can be protected from the interference of external matter and the like. Similarly, the lower wall 24 covers substantially the entire region of the lower surface of the terminal accommodation space 35 defined by the terminal holding portion 11 and the supporting walls 15. Thus, the regions of the terminal fittings 25, 26 accommodated in the terminal accommodation space 35 can be protected from the interference of external matter and the like.

The invention is not limited to the above described embodiment. For example, the following embodiments also are included in the scope of the invention.

Although the upper wall and the lower wall are provided as the reinforcing portion in the above embodiment, the reinforcing portion may be formed only with the upper wall without forming the lower wall, may be formed only with the lower wall without forming the upper wall, may be formed with a rear wall linked substantially at a right angle to the rear end of the upper wall and the side edges of the supporting walls in addition to the upper wall (box shape with an open lower surface) or may be formed with the rear wall linked substantially at a right angle to the rear end of the lower wall and the side edges of the supporting walls in addition to the lower wall (box shape with an open upper surface).

Although the upper linking portion constitutes the plate-like upper wall in the above embodiment, the upper linking portion may be an elongated beam.

Although the lower linking portion constitutes the plate-like lower wall in the above embodiment, the lower linking portion may be an elongated beam.

Although the upper wall constituting the reinforcing portion covers substantially the entire region of the upper surface of the terminal accommodation space in the above embodiment, the upper wall may cover only a part of the upper surface of the terminal accommodation space.

Although the lower wall constituting the reinforcing portion covers substantially the entire region of the lower surface of the terminal accommodation space in the above embodiment, the lower wall may cover only a part of the lower surface of the terminal accommodation space.

Although the waterproof board connector including the receptacle projecting forward of the circuit board is described in the above embodiment, the invention can be applied also to a non-waterproof board connector including a housing entirely arranged to be accommodated on the upper surface of a circuit board in a plan view.

LIST OF REFERENCE SIGNS

P circuit board
A board connector
10 housing
11 terminal holding portion
15 supporting wall
20 reinforcing portion
21 upper linking portion
22 upper wall
23 lower end portion
24 lower wall
25 first terminal fitting (terminal fitting)
26 second terminal fitting (terminal fitting)
31 fixing bracket
35 terminal accommodation space

The invention claimed is:

1. A board connector, comprising:
a housing placed on a circuit board, the housing including a terminal holding wall substantially at a right angle to the circuit board, a receptacle projecting forward from the terminal holding wall, and supporting walls extending rearward from youth opposite side edge parts of the terminal holding wall;
a terminal fitting penetrating through the terminal holding wall, the terminal fitting having a front part projecting forward from the terminal holding wall and into the receptacle and a rear part projecting rearward from the terminal holding wall and being connectable to the circuit board behind the terminal holding wall, at least a portion of the rear part of the terminal fitting being between the supporting walls;
fixing brackets mounted respectively on the supporting walls, the fixing brackets being fixable to the circuit board by soldering; and
a reinforcing portion linking the supporting walls and a rear surface of the terminal holding wall.

2. The board connector of claim 1, wherein the reinforcing portion includes an upper linking portion linking upper end parts of the supporting walls and an upper end part of the terminal holding wall.

3. The board connector of claim 2, wherein the upper linking portion constitutes a plate-like upper wall substantially at a right angle to the terminal holding wall and the supporting walls.

4. The board connector of claim 3, wherein the upper wall covers a substantially entire region of an upper surface of a terminal accommodation space defined by the terminal holding wall and the supporting walls.

5. The board connector of claim 4, wherein the reinforcing portion includes a lower linking portion linking lower parts of the supporting walls and a lower part of the terminal holding wall.

6. The board connector of claim 5, wherein the lower linking portion constitutes a plate-like lower wall substantially at a right angle to the terminal holding wall and the supporting walls.

7. The board connector of claim 6, wherein the lower wall covers a substantially entire region of a lower surface of a terminal accommodation space defined by the terminal holding wall and the supporting walls.

8. The board connector of claim 1, wherein the reinforcing portion includes a lower linking portion linking lower parts of the supporting walls and a lower part of the terminal holding wall.

9. The board connector of claim 8, wherein the lower linking portion constitutes a plate-like lower wall substantially at a right angle to the terminal holding wall and the supporting walls.

10. The board connector of claim 9, wherein the lower wall covers a substantially entire region of a lower surface of a terminal accommodation space defined by the terminal holding wall and the supporting walls.

11. The board connector of claim 1, wherein a rear end of the terminal fitting forms a board connecting portion configured to be connected to the circuit board, and wherein the housing further comprises protection walls projecting rearward from the support walls to positions aligned with or rearward of the board connecting portion of the terminal fitting.

12. The board connector of claim 11 further comprising resilient supports extending from upper ends of the protection walls in directions away from one another, legs projecting down from the respective resilient supports at positions spaced laterally outward from the protection walls, locks projecting down from lower ends of the legs and being engageable in locking holes formed in the circuit board, wherein the resilient supports enable lateral movement of the legs to accommodate manufacturing tolerances in positions of the locking holes in the circuit board.

* * * * *